United States Patent
Eckel et al.

(10) Patent No.: US 10,984,881 B1
(45) Date of Patent: Apr. 20, 2021

(54) MEMORY SUB-SYSTEM SELF-TESTING OPERATIONS

(71) Applicant: Micron Technology, Inc., Boise, ID (US)

(72) Inventors: Nathan A. Eckel, Lucas, TX (US); Keith A. Benjamin, Blaine, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/713,108

(22) Filed: Dec. 13, 2019

(51) Int. Cl.
*G11C 29/00* (2006.01)
*G11C 29/02* (2006.01)
*G11C 29/38* (2006.01)
*G11C 29/50* (2006.01)
*G11C 29/12* (2006.01)
*G11C 29/48* (2006.01)

(52) U.S. Cl.
CPC ...... *G11C 29/028* (2013.01); *G11C 29/12015* (2013.01); *G11C 29/38* (2013.01); *G11C 29/48* (2013.01); *G11C 29/50012* (2013.01)

(58) Field of Classification Search
CPC ..................................................... G11C 29/10
USPC ........................................................ 714/718
See application file for complete search history.

(56) References Cited

U.S. PATENT DOCUMENTS

| | | | |
|---|---|---|---|
| 6,253,333 B1 * | 6/2001 | Bogumil | G01R 31/3016 713/503 |
| 6,785,856 B1 * | 8/2004 | Parker | G11C 29/12015 714/734 |
| 10,031,677 B1 | 7/2018 | Shallal et al. | |
| 2003/0056160 A1 * | 3/2003 | Kohnen | G11C 29/42 714/718 |
| 2006/0069966 A1 * | 3/2006 | Liu | G11C 29/10 714/718 |
| 2017/0060794 A1 * | 3/2017 | Zwart | G06F 13/4068 |

* cited by examiner

*Primary Examiner* — Min Huang
(74) *Attorney, Agent, or Firm* — Brooks, Cameron & Huebsch, PLLC

(57) ABSTRACT

A method includes requesting, by a component of a memory sub-system controller, control of a data path associated with a memory device coupleable to the controller. The method can include generating, by the component, data corresponding to an operation to test the memory device and causing, by the component, the data to be injected to the data path such that the data is written to the memory device. The method can further include reading, by the component, the data written to the memory device and determining, by the component, whether the data read by the component from the memory device matches the data written to the memory device.

15 Claims, 7 Drawing Sheets

MEMORY SUB-SYSTEM SELF-TESTING OPERATIONS

TECHNICAL FIELD

Embodiments of the disclosure relate generally to memory sub-systems, and more specifically, relate to memory sub-system self-testing operations.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
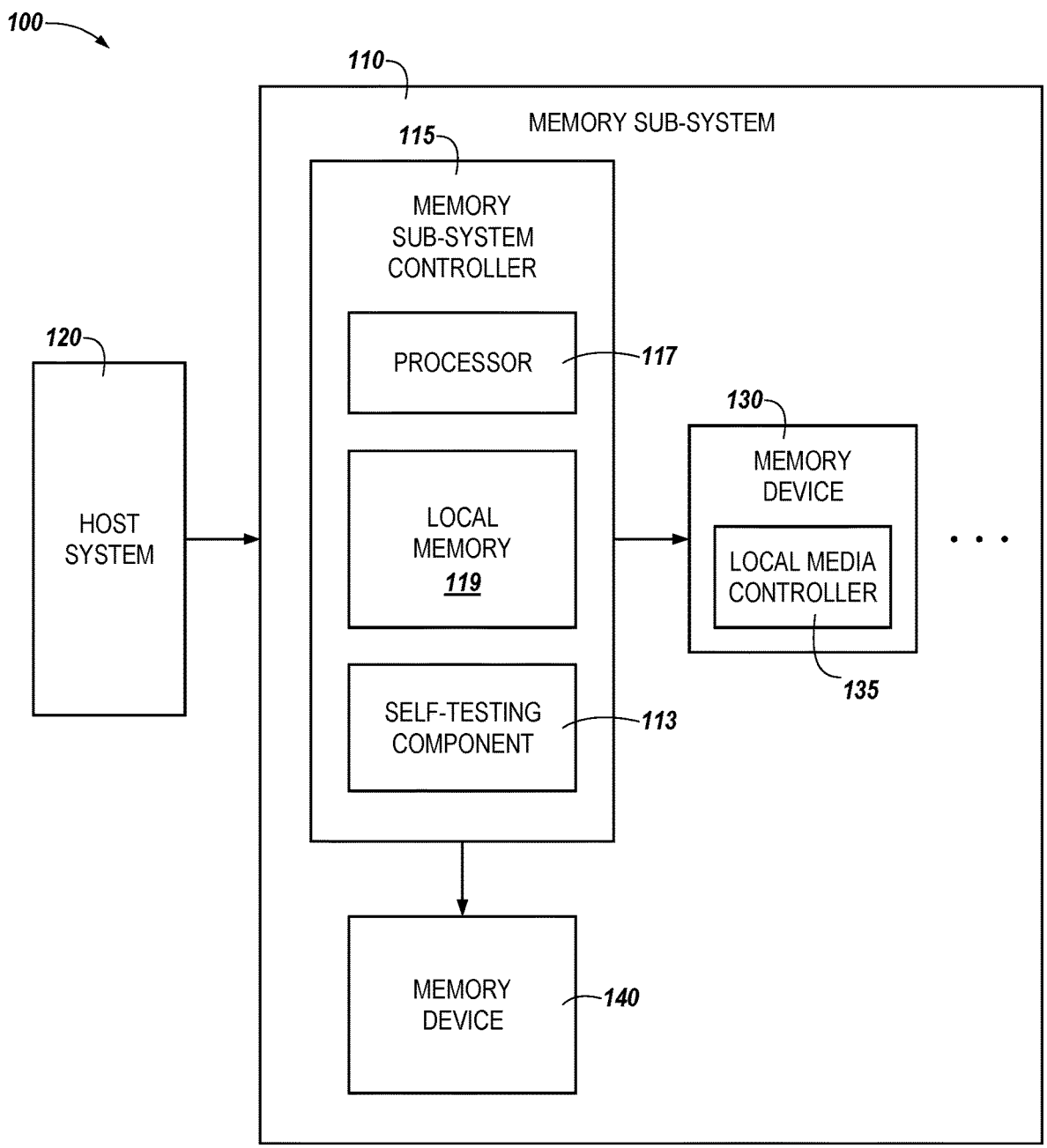
FIG. 1 illustrates an example computing system that includes a memory sub-system in accordance with some embodiments of the present disclosure.

Aspects of the present disclosure are directed to self-testing operations performed using a memory sub-system, in particular to memory sub-systems that include a self-testing operation component. A memory sub-system can be a storage device, a memory module, or a hybrid of a storage device and memory module. An example of a memory sub-system is a storage system, such as a non-volatile dual in-line memory module (NVDIMM). Examples of storage devices and memory modules are described below in conjunction with FIG. 1, et alibi. In general, a host system can utilize a memory sub-system that includes one or more memory components, such as "memory devices" that store data. The host system can provide data to be stored at the memory sub-system and can request data to be retrieved from the memory sub-system.

A non-volatile dual in-line memory module (NVDIMM) is a type of random-access memory that has volatile memory for normal operation and non-volatile memory in which to transfer the contents of the volatile memory if the power fails, using an on-board backup power source. NVDIMM-N is a dual in-line memory module (DIMM) typically with flash storage and traditional dynamic random-access memory (DRAM) on the same module. A host processing unit can access the traditional DRAM directly. A host, with respect to a memory unit, can be structured as one or more processors that control data in and out of the memory unit in response to an application being run by the host. In the event of a power failure, the NVDIMI-N copies all the data from its volatile traditional DRAM or set of DRAMs to its persistent flash storage and copies all the data back to the volatile traditional DRAM or set of DRAMs, when power is restored. The transfer of the state of all the DRAM data into persistent data on the persistent flash storage can be performed on a power cycle. The NVDIMM has its own battery backup power source or access to a dedicated power source to allow the NVDIMM to complete the save.

In various embodiments, a set of control registers in a NVDIMM can be implemented to provide for a partial save of memory in the NVDIMM to non-volatile memory, where "memory" refers to the main memory of the NVDIMM. The main memory is the volatile memory, such as a DRAM, which stores user data. The set of control registers can provide a mechanism to conduct a partial save by containing a starting offset of a portion of the volatile memory to identify a start of a save operation and by containing an amount of content of the volatile memory to be saved. A host can populate the set of control registers in the NVDIMM with an identification of a start of a save operation and an amount of content for the save operation. This set of control registers can also control the inverse operation that restores the partial save back to the volatile memory of the NVDIMM. This structure for maintaining data stored on a NVDIMM provides a host with added flexibility to handle user data with respect to applications for which the host is processing. The host is provided access to perform a full content or a partial content save at any offset. This can provide the host with the ability to have better control, and more control over what is saved and restored.

By leveraging the save and/or partial save capabilities of the NVDIMM, embodiments herein can allow for built-in self-testing of components associated with an NVDIMNM device. For example, memory devices (e.g., volatile memory and/or non-volatile memory) associated with the NVDIMM, clock component(s) (e.g., a registering clock driver), as well as various data paths e.g., data paths between non-volatile and volatile memory devices) and/or interfaces (e.g., non-volatile memory interfaces, system memory interfaces, LCOM interfaces, etc.) associated with the NVDIMMI can be checked for integrity using the built-in self-testing operations described herein.

As described in more detail, herein, the built-in self-testing operations can be carried out using a built-in self-testing component (referred to herein for simplicity as a "component") that is resident on the NVDIMM. In some embodiments, the built-in self-testing component can be resident on a controller (e.g., a memory sub-system controller) associated with the NVDIMM. As used herein, the term "resident on" refers to something that is physically located on a particular component. For example, the built-in self-testing component being "resident on" the controller refers to a condition in which the built-in self-testing component is physically located on the controller. The term "resident on" can be used interchangeably with other terms such as "deployed on" or "located on," herein.

By providing the built-in self-testing component within the NVDIMNM (e.g., resident on the controller), improved visibility to the other components of a memory sub-system, such as an NVDIMMI can be realized in contrast to approaches in which such a component is not deployed within the memory sub-system. For example, in some approaches, the memory sub-system can be presented to the host in an opaque fashion such that the host has little, if any visibility to the data paths, interfaces, and other components associated with the memory sub-system. This is generally due to a desire in some approaches to shield various aspects of the memory sub-system architecture to the host. However, by shielding various aspects of the memory sub-system architecture from the host, testing and/or troubleshooting of internal data paths, interfaces, and other components associated with the memory sub-system may not be possible.

In contrast, in embodiments herein which include a built-in self-testing component resident on the memory sub-system or the memory sub-system controller, it can be possible to perform tests and/or troubleshoot various internal data paths, interfaces, and other components associated with the memory sub-system that are shielded from the host in some other approaches. For example, because a built-in self-testing component can be provided resident on the memory sub-system and/or the memory sub-system controller, embodiments described herein can allow for the built-in self-testing component to access data paths and interfaces internal to the memory sub-system, assert various commands and/or signals (e.g., test vectors, bit patterns, etc.) that can traverse the internal data paths and/or interfaces, and analyze characteristics of the commands and/or signals as part of performing a self-testing operation on the memory sub-system and/or particular components or portions of the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMNM (SO-DIMI), and a non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMNM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a dual in-line memory module (DIMNX) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point are described, the memory device 130 can be based on any other type of non-volatile memory or storage device, such as such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a self-testing component 113 that can be configured to orchestrate and/or perform testing operations on various components, data paths, and/or interfaces of the memory sub-system 110. Although not shown in FIG. 1 so as to not obfuscate the drawings, the self-testing component 113 can include various circuitry to facilitate grading and allocation of the sets of memory cells. For example, the self-testing component 113 can include a special purpose circuitry in the form of an ASIC, FPGA, state machine, and/or other logic circuitry that can allow the self-testing component 113 to orchestrate and/or perform testing operations on various components, data paths, and/or interfaces of the memory sub-system 110.

As described in more detail in connection with FIG. 2, FIG. 3, and FIG. 4 the self-testing component 113 can be communicatively coupleable to the memory devices 130 and can access the memory device 130, the memory device 140, a clock component (e.g., the clock component 218 illustrated in FIG. 2), internal data paths of the memory sub-system 110, and/or interfaces of the memory sub-system 110 to perform the operations described herein. In some embodiments, the operations performed by the self-testing component 113 can be performed during an initialization or pre-initialization stage of manufacture of the memory sub-system 110 and/or the memory sub-system controller 115. Accordingly, in some embodiments, the self-testing component 113 can perform the operations described herein during fabrication and/or subsequent to fabrication of the memory sub-system 110 but prior to packaging of the memory sub-system 110. Embodiments are not so limited, however, and in some embodiments, the self-testing component 113 can perform the operations described herein during an operational stage of the memory sub-system 110 to, for example, perform field testing and/or troubleshooting in the field of the memory sub-system 110.

Figure 4:
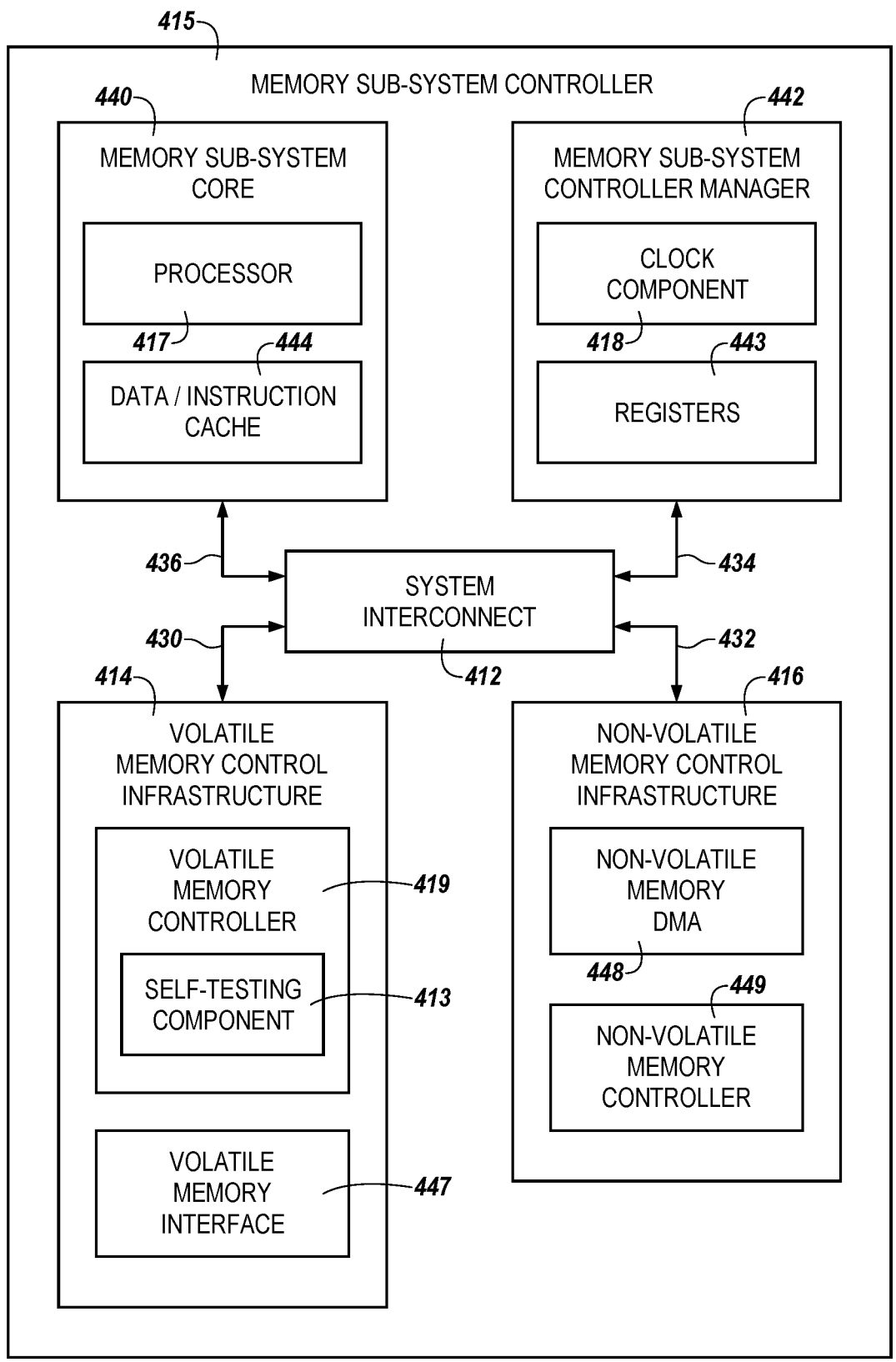
FIG. 4 illustrates yet another example of a memory sub-system controller and self-testing component in accordance with some embodiments of the present disclosure.

In a non-limiting example, the self-testing component 113 (e.g., the component) is resident on the memory sub-system controller 115 and can be configured to request control of a data path (e.g., the data path 430 and/or the data path 432 illustrated in FIG. 4, herein) associated with at least one memory device (e.g., the memory device 130, the memory device 140, or both). In some embodiments, the data path can, prior to injection of the data corresponding to the operation to test the first memory device (or the operation to test a second memory device described below), be used to transfer information between the host system 120 and the memory sub-system controller and at least one memory device associated with the memory sub-system 110.

The self-testing component 113 can be configured to generate data corresponding to an operation to test a particular memory device (e.g., a first memory device) and cause the data to be injected to the data path such that the data is written to the first memory device. The data can be written to the first memory device as part of an operation to save the data to the first memory device or as part of an operation to perform a partial save operation using the first memory device.

The data generated by the component 113 and injected into the data path can be a quantity of bits that corresponds to a specific bit pattern. For example, the data can be a particular bit pattern, such as an A5 bit pattern, a user control bit pattern, a bi-directional (DQ) pin control data pattern, a bit pattern containing all "1s" all "0s" or a combination of "1s" and "0s," or other suitable bit pattern that can be written to, and read from, the first memory device (or a memory device different than the first memory device). In some embodiments, the data can include a specific recurring set of alphanumeric characters such as a string of alternating ones and zeros or a quantity of ones (or zeros) followed by a quantity of zeros (or ones). It will be appreciated that embodiments are not limited to these enumerated examples and the data can include and pattern of bits and/or data that can be written to, and read from, the memory device, etc.

The self-testing component 113 can be further configured to read the data written to the first memory device and determine whether the data read by the component 113 from the first memory device matches the data written to the first memory device. In some embodiments, the self-testing component 113 can compare the data that was generated and injected into the data path by the self-testing component 113 to the data retrieved from the first memory device to determine whether the data read by the component 113 from the first memory device matches the data written to the first memory device. If the data read by the component 113 from the first memory device matches the data written to the first memory device, the self-testing component 113 can determine that the first memory device and/or the data path coupling the first memory device to the memory sub-system controller 115 are functioning as intended (e.g., are in a standard working order).

Continuing with the above non-limiting example, the self-testing component 113 can be configured to generate data corresponding to an operation to test a second memory device (e.g., the memory device 130 or the memory device 140). In this example, if the first memory device that was subjected to the test operation was the memory device 130, the second memory device can be the memory device 140. Conversely, if the first memory device subjected to the test operation was the memory device 140, the second memory device can be the memory device 130.

The component 113 can be configured to cause the data to be injected to the data path such that the data is written to the second memory device. As described above, the data can be written to the second memory device as part of an operation to save the data to the second memory device or as part of an operation to perform a partial save operation using the second memory device. In some embodiments the data path to which the data is injected can be different than the data path used to test the first memory device. For example, if the data path used to test the first memory device is the data path 430 illustrated in FIG. 4, the data can be injected into the data path 432 illustrated in FIG. 4 to test the second memory device. Conversely, if the data path used to test the first memory device is the data path 432 illustrated in FIG. 4, the data can be injected into the data path 430 illustrated in FIG. 4 to test the second memory device. Embodiments are not so limited, however, and in some embodiments, the data can be injected to other data paths (e.g., the data path 434, the data path 436, etc. illustrated in FIG. 4, herein).

The component 113 can be configured to read the data written to the second memory device and determine whether the data read by the component from the second memory device matches the data written to the second memory device. As described above, the self-testing component 113 can compare the data that was generated and injected into the data path by the self-testing component 113 to the data retrieved from the second memory device to determine whether the data read by the component 113 from the second memory device matches the data written to the second memory device. If the data read by the component 113 from the second memory device matches the data written to the second memory device, the self-testing component 113 can determine that the second memory device and/or the data path coupling the second memory device to the memory sub-system controller 115 are functioning as intended (e.g., are in a standard working order).

In some embodiments, the component 113 can generate a first indication in response to a determination that the data read by the component from the first memory device matches the data written to the first memory device and/or generate a second indication in response to a determination that the data read by the component from the first memory device does not match the data written to the first memory device. Similarly, the component 113 can generate a first indication in response to a determination that the data read by the component from the second memory device matches the data written to the second memory device and/or generate a second indication in response to a determination that the data read by the component from the second memory device does not match the data written to the second memory device. For example, the component 113 can generate and provide an indication that the test operation was successful (or that the test operation was unsuccessful) to aid in troubleshooting of the memory sub-system 110. In some embodiments, the indication(s) can be provided in the form of an end-user diagnostic that can assist in pinpointing specific portions of the memory sub-system 110 that are either functioning properly or are not functioning properly.

Figure 2:
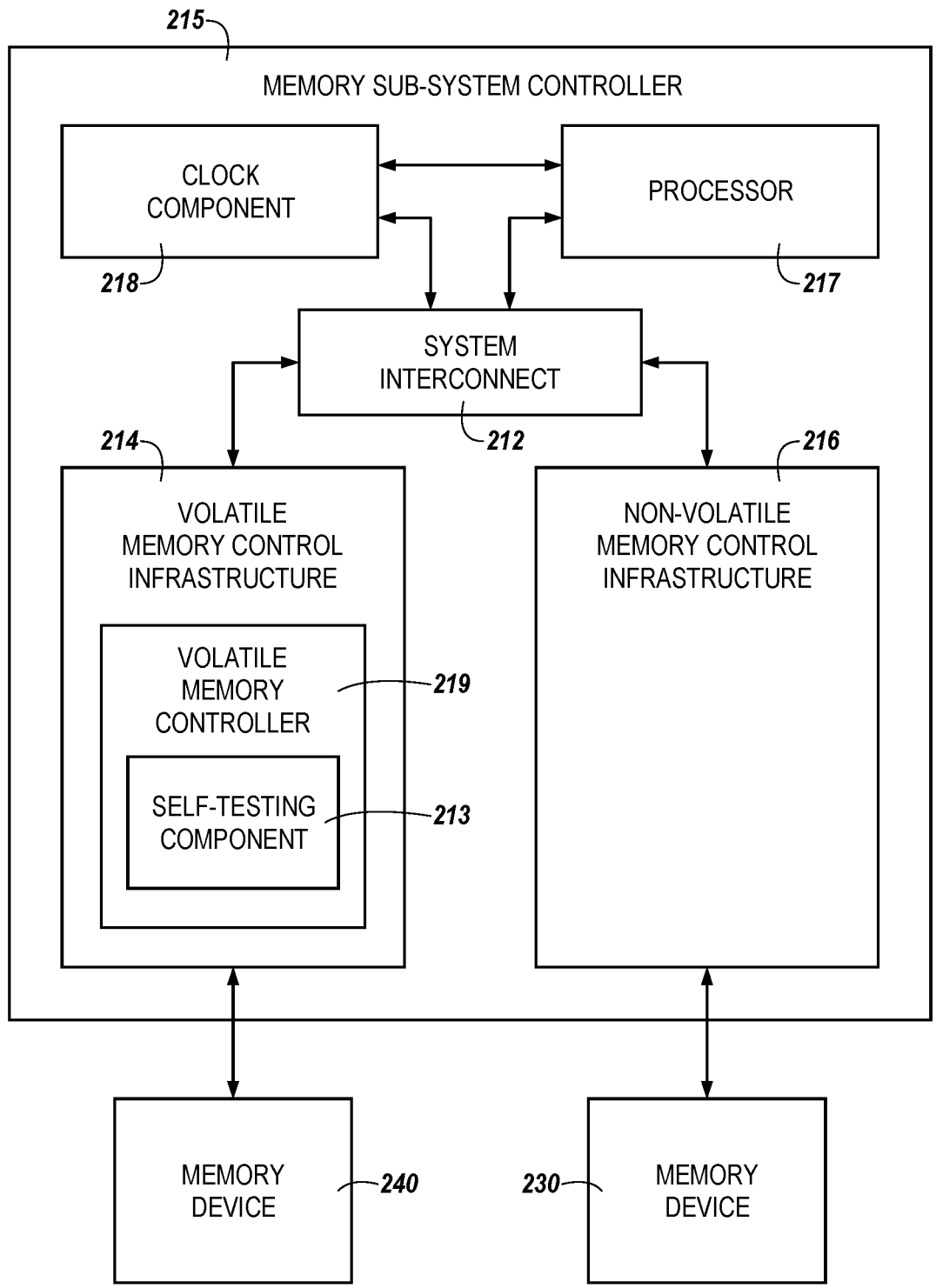
FIG. 2 illustrates an example of a memory sub-system controller and self-testing component in accordance with some embodiments of the present disclosure.

FIG. 2 illustrates an example of a memory sub-system controller 215 and self-testing component 213 in accordance with some embodiments of the present disclosure. The memory sub-system controller 215 can be analogous to the memory sub-system controller 115 illustrated in FIG. 1 and the self-testing component 213 can be analogous to the self-testing component 113 illustrated in FIG. 1. Further, the processor 217 can be analogous to the processor 117 illustrated in FIG. 1, the memory device 230 can be analogous to the memory device 130 illustrated in FIG. 1 and the memory device 240 can be analogous to the memory device 140 illustrated in FIG. 1. In addition to the self-testing component 213, the processor 217, the memory device 230, and the memory device 240, the memory sub-system controller 215 can further include a clock component 218, a system interconnect 212, volatile memory control infrastructure 214, which can include a volatile memory controller 219, and non-volatile memory control infrastructure 216.

The clock component 218 can provide timing signals to the memory sub-system controller 215 to facilitate performance of memory operations orchestrated by the memory sub-system controller 215. In some embodiments, the clock component 218 can be a register clock driver that can be configured to buffer and/or re-drive commands and/or addresses to the memory device 230 and/or the memory device 240 during operation of the memory sub-system controller 215.

The system interconnect 212 can be a communication sub-system that can allow commands, signals, instructions, and the like to be passed between the processor 217, clock component 218, volatile memory control infrastructure 214, and the non-volatile memory control infrastructure 216. The system interconnect 212 can be a crossbar ("XBAR"), a network on a chip, or other communication subsystem that allows for interconnection and interoperability between the processor 217, clock component 218, volatile memory control infrastructure 214, and the non-volatile memory control infrastructure 216. For example, the system interconnect 212 can facilitate visibility between the processor 217, clock component 218, volatile memory control infrastructure 214, and the non-volatile memory control infrastructure 216 to facilitate communication therebetween. In some embodiments, communication between the processor 217, clock component 218, volatile memory control infrastructure 214, and the non-volatile memory control infrastructure 216 via the system interconnect 212 can be provided via respective data paths (shown by the arrows connecting the system interconnect 212 to the other components of the memory sub-system controller 215), which are described in more detail in connection with FIG. 4, herein.

The volatile memory control infrastructure 214 can include circuitry to control data transfers between the memory device 230 and a host, such as the host system 120 illustrated in FIG. 1. For example, the volatile memory control infrastructure 214 can include various interfaces, direct media access components, registers, and/or buffers, which are described in more detail in connection with FIG. 4, herein.

In the embodiment illustrated in FIG. 2, the self-testing component 213 is resident on the volatile memory control infrastructure 214. As described above, the self-testing component can be configured to facilitate performance of built-in self-testing operations of the memory sub-system controller 215 and/or a memory subsystem (e.g., the memory sub-system 110 illustrated in FIG. 1) in which the memory sub-system controller 215 is deployed. For example, the self-testing component 213 can be configured to generate data corresponding to an operation to test the first memory device (e.g., the memory device 230) or the second memory device (e.g., the memory device 240), or both, and cause the data to be injected into a data path coupling at least one of the first memory device or the second memory device to the memory sub-system such that the data is written to at least one of the first memory device or the second memory device. The self-testing component can be further configured to read the data written to the at least one of the first memory device or the second memory device and/or determine whether the read data matches the data written to the at least one of the first memory device or the second memory device.

In some embodiments, the self-testing component 213 can be configured to cause the data to be injected into the data path such that the data is written to the other of the first memory device or the second memory device, read the data written to other of the first memory device or the second memory device, and/or determine whether the data from the other of the first memory device or the second memory device matches the data written to the other of the first memory device or the second memory device.

The self-testing component can be further configured to receive timing information from the clock component 218, perform an operation to compare a frequency of a timing signal generated by the clock component to an expected timing signal, and determine, based on the comparison, whether the frequency of the timing signal and the expected timing signal are substantially equivalent. As used herein, the term "substantially" intends that the characteristic needs not be absolute, but is close enough so as to achieve the advantages of the characteristic. For example, "substantially equivalent" is not limited to absolute equivalence, and can include slight variations in equivalence that can be due to manufacturing limitations and/or operational characteristics of the memory sub-system controller 215.

The non-volatile memory control infrastructure 216 can include circuitry to control data transfers between the memory device 240 and a host, such as the host system 120 illustrated in FIG. 1. For example, the volatile memory control infrastructure 214 can include various interfaces, direct media access components, registers, and/or buffers, which are described in more detail in connection with FIG. 4, herein.

Figure 3:
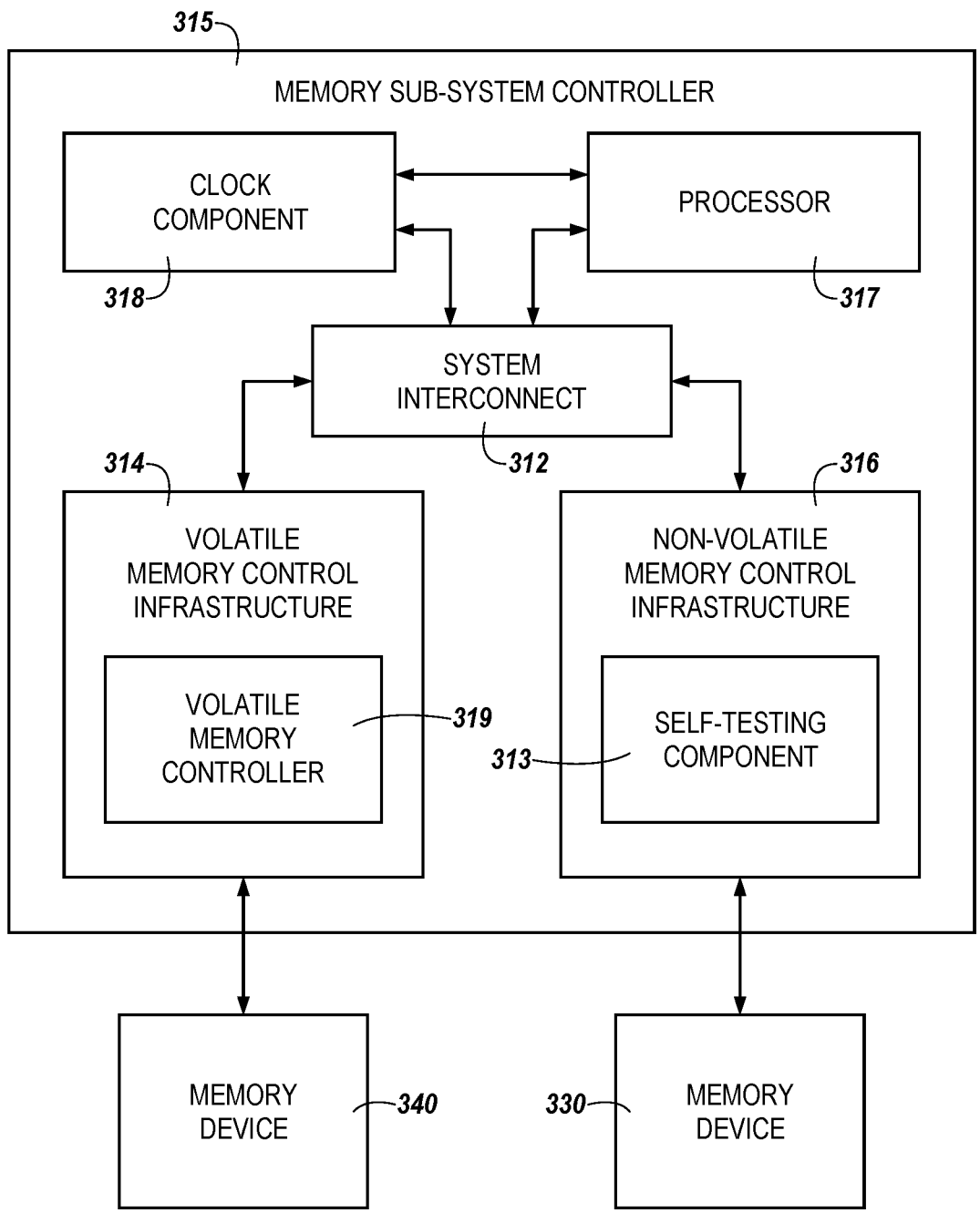
FIG. 3 illustrates another example of a memory sub-system controller and self-testing component in accordance with some embodiments of the present disclosure.

FIG. 3 illustrates another example of a memory sub-system controller 315 and self-testing component 313 in accordance with some embodiments of the present disclosure. The memory sub-system controller 315 can be analogous to the memory sub-system controller 215 illustrated in FIG. 2 and the self-testing component 313 can be analogous to the self-testing component 213 illustrated in FIG. 2. Further, the processor 317 can be analogous to the processor 217 illustrated in FIG. 2, the memory device 330 can be analogous to the memory device 230 illustrated in FIG. 2 and the memory device 340 can be analogous to the memory device 240 illustrated in FIG. 2. In addition to the self-testing component 313, the processor 317, the memory device 330, and the memory device 340, the memory sub-system controller 315 can further include a clock component 318, a system interconnect 312, volatile memory control infrastructure 314, which can include a volatile memory controller 319, and non-volatile memory control infrastructure 316, which can be analogous to the clock component 218, the system interconnect 212, volatile memory control infrastructure 214, the volatile memory controller 219, and non-volatile memory control infrastructure 216 illustrated in FIG. 2.

In the embodiment illustrated in FIG. 3, the self-testing component 313 is resident on the non-volatile memory control infrastructure 216. As described above, the self-testing component can be configured to facilitate performance of built-in self-testing operations of the memory sub-system controller 315 and/or a memory subsystem (e.g., the memory sub-system 110 illustrated in FIG. 1) in which the memory sub-system controller 315 is deployed. For example, the self-testing component 213 can be configured to generate data corresponding to an operation to test the first memory device (e.g., the memory device 330) or the second memory device (e.g., the memory device 340), or both, and cause the data to be injected into a data path coupling at least one of the first memory device or the second memory device to the memory sub-system such that the data is written to at least one of the first memory device or the second memory device. The self-testing component can be further configured to read the data written to the at least one of the first memory device or the second memory device and/or determine whether the read data matches the data written to the at least one of the first memory device or the second memory device.

FIG. 4 illustrates yet another example of a memory sub-system controller 415 and self-testing component 413 in accordance with some embodiments of the present disclosure. The memory sub-system controller 415 can be analogous to the memory sub-system controller 315 illustrated in FIG. 3 and the self-testing component 413 can be analogous to the self-testing component 313 illustrated in FIG. 3. Further, the processor 417, the clock component 418, the system interconnect 412, volatile memory control infrastructure 414, the volatile memory controller 419, and non-volatile memory control infrastructure 416 can be analogous to the processor 317, the clock component 318, the system interconnect 312, volatile memory control infrastructure 314, the volatile memory controller 319, and non-volatile memory control infrastructure 316 illustrated in FIG. 3.

As shown in FIG. 4, the memory sub-system controller can further include a memory sub-system control manager 442, which can include the clock component 418 and registers 443 and a memory sub-system core 440, which can include the processor 417 and a data and/or instruction cache 444. In addition, the volatile memory control infrastructure 414 can include a volatile memory interface 447 and the volatile memory controller 419, which can include the self-testing component 413. Further, the non-volatile memory control infrastructure 416 can include a non-volatile memory direct memory access (DMA) component 448 and a non-volatile memory controller 449.

The memory sub-system controller manager 442 can be coupled to the system interconnect 412 via a data path 434, which can allow for commands, signals, data, and other information to be transferred between the memory sub-system controller manager 442, the memory sub-system core 440, the volatile memory control infrastructure 414, and the non-volatile memory control infrastructure 416. The registers 443 associated with the memory sub-system controller manager 442 can contain identification information corresponding to a portion of a non-volatile memory device (e.g., the memory device 140 illustrated in FIG. 1) and/or a volatile memory device (e.g., the memory device 130 illustrated in FIG. 1) in which data may be written as part of a save or partial save operation performed as part of performing the self-testing operations described herein.

The memory sub-system core 440 can be coupled to the system interconnect 412 via a data path 436, which can allow for commands, signals, data, and other information to be transferred between the memory sub-system core 440, the memory sub-system controller manager 442, the volatile memory control infrastructure 414, and the non-volatile memory control infrastructure 416. The memory sub-system core 440 can be a reduced instruction set computing (RISC) device such as a RISC-V device. In some embodiments, the memory sub-system core 440 can be a XILINX® MicroBlaze soft processor core, or other suitable processing core.

The volatile memory control infrastructure 414 can include a volatile memory controller 419, which can include the self-testing component 413, and/or a volatile memory interface 447. The volatile memory interface 447 can, in some embodiments, be an LCOM interface (e.g., an interface that operates according to the JEDEC LCOM interface protocol), however, embodiments are not so limited and the volatile memory interface 447 can be any interface that provides an interface between the memory sub-system controller 415 and a volatile memory device coupled thereto. Although shown as being resident on the volatile memory control infrastructure 414, the self-testing component 413 can be deployed on the non-volatile memory control infrastructure 416, as shown in FIG. 3, herein.

The non-volatile memory control infrastructure 416 can include a non-volatile memory direct memory access (DMA) component 448 and a non-volatile memory controller 449. The non-volatile DMA component 448 can be configured to provide access to non-volatile memory devices coupled to the memory sub-system controller 415 independent of intervention from a host system (e.g., the host system 120 illustrated in FIG. 1). Although not explicitly shown in FIG. 4 so as not to obfuscate the drawings, the non-volatile memory controller 449 can interfaces (e.g., ONFI interface(s), etc.) that can facilitate communication between non-volatile memory devices coupled to the memory sub-system controller 415, encryption engines (e.g., an advance encryption standard (AES) engine) for encryption/decryption of data, etc.

As described above, the self-testing component 413 can facilitate performance of self-testing operations on components of the memory sub-system controller 415. For example, the self-testing component 413 can request control of any of the data paths 430, 432, 434, and/or 436 and inject data (e.g., test data, test vectors, etc.) to the data paths to test the functionality of the various components of the memory sub-system controller 415, in a similar manner as described above.

Non-exhaustive examples of data paths and components that can be tested using the self-testing component 413 and the methodologies described herein can include non-volatile memory interfaces associated with the non-volatile memory control infrastructure 416, the volatile memory interface 447, internal data paths (e.g., the data paths 430, 432, 434, and 436) of the memory sub-system controller 415, a data path running through the memory sub-system controller 415 that couples volatile memory devices to non-volatile memory devices via the memory sub-system controller 415, encryption engines of the memory sub-system controller 415, error correction engines of the memory sub-system controller 415, erase capabilities of memory devices coupled to the memory sub-system controller 415, volatile memory refresh operations, volatile memory data integrity, timing signal generation and propagation of the clock component 418, timing properties associated with the non-volatile memory controller 449, etc.

In a non-limiting example, the self-testing component 413 can request control of the data path 430 and the data path 432, generate data (e.g., test data, a test vector, etc.) for use in a testing operation, and inject the data into the non-volatile memory controller 449. The non-volatile memory controller 449 can cause the data to be saved in a non-volatile memory device (e.g., the memory device 230 illustrated in FIG. 2. Subsequently, the self-testing component 413 can cause the data to be read from the non-volatile memory device and can perform an operation to compare the data read from the non-volatile memory device to the data saved to the non-volatile memory device to determine if the data written matches the data read. If the data written to the non-volatile memory device does not match the data read from the non-volatile memory device, the self-testing component 413 can determine that an error involving the non-volatile memory device has occurred.

Continuing with this example, if the data written to the non-volatile memory device matches the data read from the non-volatile memory device, the self-testing component 413 can determine that the non-volatile memory device is operating properly. If it is determined that the non-volatile memory device is operating properly, the self-testing component 413 can inject the data into the volatile memory controller 419 as part of the testing operation. The volatile memory controller 419 can cause the data to be saved in a volatile memory device (e.g., the memory device 240 illustrated in FIG. 2. Subsequently, the self-testing component 413 can cause the data to be read from the volatile memory device and can perform an operation to compare the data read from the volatile memory device to the data saved to the volatile memory device to determine if the data written matches the data read. If the data written to the volatile memory device does not match the data read from the volatile memory device, the self-testing component 413 can determine that an error involving the volatile memory device has occurred.

If the data written to the volatile memory device matches the data read from the volatile memory device, the self-testing component 413 can determine that the volatile memory device is operating properly. If it is determined that the volatile memory device is operating properly, the self-testing component 413 can cause the data to be transferred from the volatile memory device to the non-volatile memory device as part of an operation to test a data path internal to the memory sub-system controller 415 that couples the volatile memory device to the non-volatile memory device. Once the data has been transferred from the volatile memory device to the non-volatile memory device, the self-testing component 413 can cause the data to be transferred from the non-volatile memory device back to the volatile memory device. Once the data has been restored in the volatile memory device, the self-testing component can read the data from the volatile memory device and determine if the data read from the volatile memory device matches the data transferred from the volatile memory device to the non-volatile memory device. If the data read from the volatile memory device does not match the data transferred between the volatile memory device and the non-volatile memory device, the self-testing component 413 can determine that an error involving a data path internally coupling the volatile memory device and the non-volatile memory device has occurred. In contrast, if the data read from the volatile memory device matches the data transferred between the volatile memory device and the non-volatile memory device, the self-testing component 413 can determine that the data path internally coupling the volatile memory device and the non-volatile memory device is operating properly.

Figure 5:
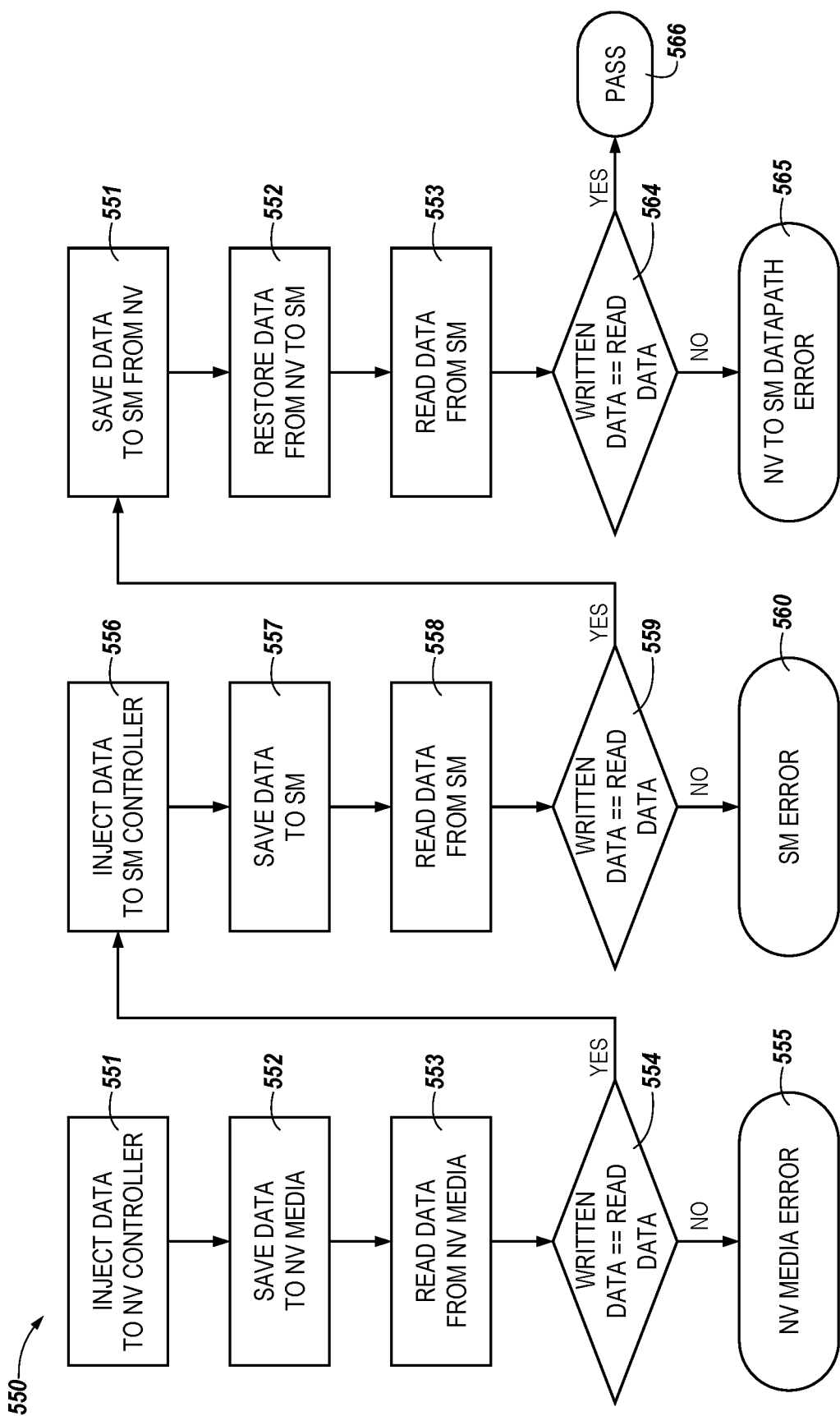
FIG. 5 illustrates a flow diagram corresponding to memory sub-system self-testing operations in accordance with some embodiments of the present disclosure.

FIG. 5 illustrates a flow diagram 550 corresponding to memory sub-system self-testing operations in accordance with some embodiments of the present disclosure. At block 551, the self-testing component (e.g., the self-testing component 413 illustrated in FIG. 4) can cause data (e.g., test data, test vectors, etc.) into a non-volatile memory controller (e.g., the non-volatile memory controller 449 illustrated in FIG. 4). At block 552, the data can be saved to non-volatile media (e.g., the non-volatile memory device 230 illustrated in FIG. 3).

At block 553, the data can be read from the non-volatile memory. In some embodiments, the data is read from the non-volatile media by the self-testing component. The self-testing component can then, at block 554, compare the data read from the non-volatile media to the data written to the non-volatile media to determine if the data read from the non-volatile media matches the data written to the non-volatile media. If the data read from the non-volatile media does not match the data written to the non-volatile media, at block 555, the self-testing component can determine that an error involving the non-volatile media has occurred.

In contrast, if the data read from the non-volatile media matches the data written to the non-volatile media, at block 556, the self-testing component can inject data into a system memory controller (e.g., the volatile memory controller 419 illustrated in FIG. 4). At block 557, the data can be then be saved to system memory (e.g., the volatile memory device 240 illustrated in FIG. 3).

At block 558, the data can be read from the system memory (SM). In some embodiments, the data is read from the system memory by the self-testing component. The self-testing component can then, at block 559, compare the data read from the system memory to the data written to the system memory to determine if the data read from the system memory matches the data written to the system memory. If the data read from the system memory does not match the data written to the system memory, at block 560, the self-testing component can determine that an error involving the system memory has occurred.

In contrast, if the data read from the system memory matches the data written to the system memory, at block 561, the self-testing component can cause the data to be written directly from the system memory to non-volatile memory. At block 562, the data can be restored (e.g., transferred) from the non-volatile memory to the system memory. At block 563, the data can be read from the system memory using the self-testing component and compared to the data written from the system memory to the non-volatile memory at block 564. If the data written to the system memory at block 561 does not match the data read from the system memory at block 563, the self-testing component can, at block 565, determine that an error in the data path coupling the non-volatile memory to the system memory has occurred. In contrast, if the data written to the system memory at block 561 matches the data read from the system memory at block 563, the self-testing component can, at block 566, determine that the data path coupling the non-volatile memory to the system memory is functioning as intended.

Figure 6:
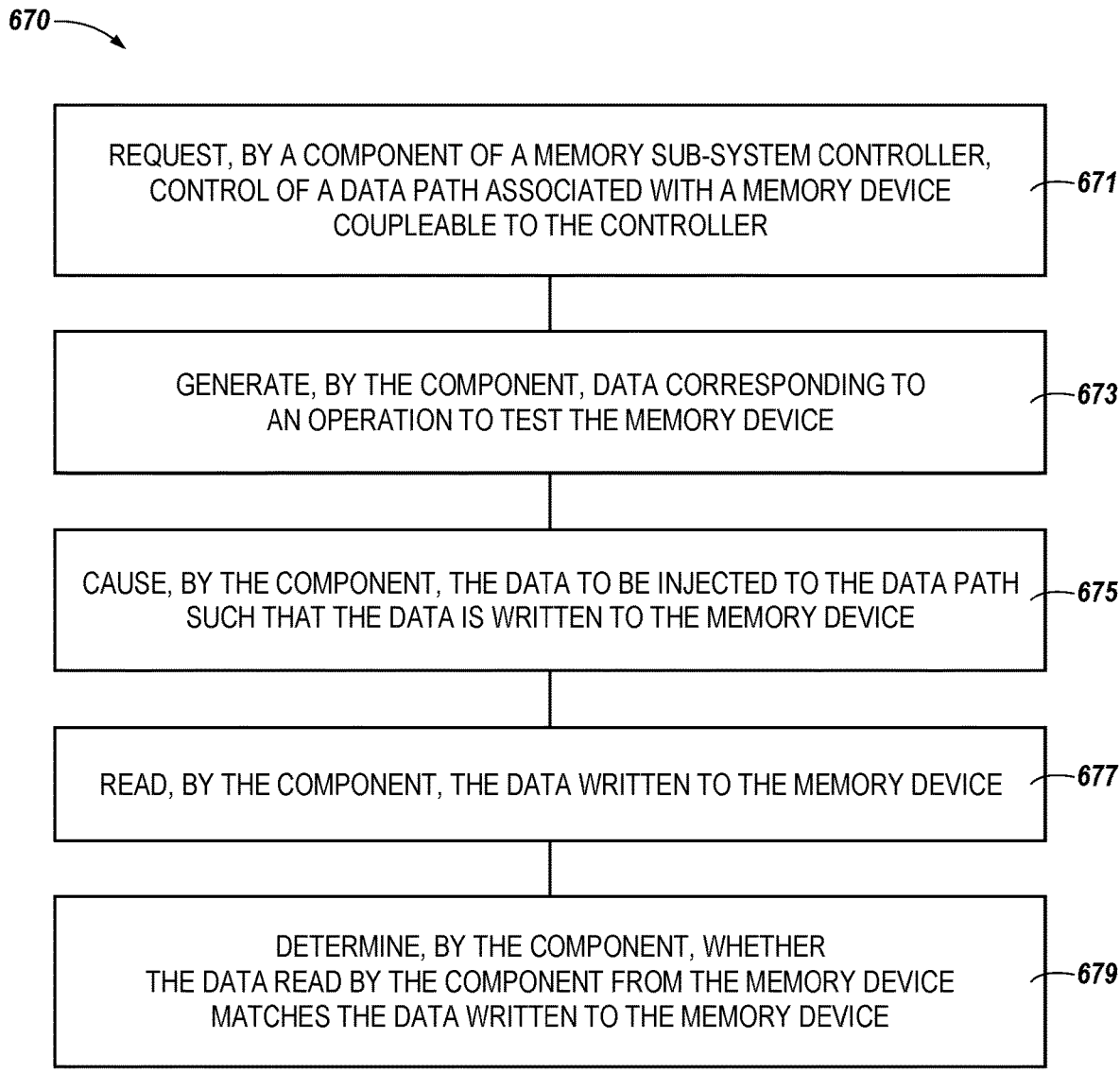
FIG. 6 is a flow diagram corresponding to a method for performing memory sub-system self-testing operations in accordance with some embodiments of the present disclosure.

FIG. 6 is a flow diagram corresponding to a method for performing memory sub-system self-testing operations in accordance with some embodiments of the present disclosure. The method 670 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 670 is performed by the self-testing component 113 of FIG. 1, the self-testing component 213 of FIG. 2, the self-testing component 313 of FIG. 3, and/or the self-testing component 413 of FIG. 4. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 671, the method 670 can include requesting, by a component of a memory sub-system controller, control of a data path associated with a memory device coupleable to the controller. The component can be analogous to the self-testing component 113 of FIG. 1, the self-testing component 213 of FIG. 2, the self-testing component 313 of FIG. 3, and/or the self-testing component 413 of FIG. 4, and the memory sub-system controller can be analogous to the memory sub-system controller 115 of FIG. 1, the memory sub-system controller 215 of FIG. 2, the memory sub-system controller 315 of FIG. 3, and/or the memory sub-system controller 415 of FIG. 4. As described above, the request for control of the data path can be generated by the component and allow the component to inject data to the data path as part of a memory sub-system self-testing operation.

At block 673, the method 670 can include generating, by the component, data corresponding to an operation to test the memory device. The memory device can be analogous to the memory device 130 and/or the memory device 140 of FIG. 1, the memory device 230 and/or the memory device 240 of FIG. 2, and/or the memory device 330 and/or the memory device 340 of FIG. 3.

At block 675, the method 670 can include causing, by the component, the data to be injected to the data path such that the data is written to the memory device. As described above, the data can be written to the memory device as part of a save operation or as part of a partial save operation performed by a memory sub-system, such as the memory sub-system 110 illustrated in FIG. 1. In some embodiments, the data path can be reserved for transferring of data between a host coupleable to the memory sub-system controller and the memory device prior to the component requesting control of the data path and injecting the data into the data path, as described above.

At block 677, the method 670 can include reading, by the component, the data written to the memory device. By reading the data written to the memory device, the component can verify that the data injected into the data path and written to the memory device matches, thereby providing an indication that the memory device and/or the data path are functioning properly, as described above.

At block 679, the method 670 can include determining, by the component, whether the data read by the component from the memory device matches the data written to the memory device. For example, component can compare the data that was generated and injected into the data path to the data retrieved from the memory device to determine whether the data read by the component from the memory device matches the data written to the memory device. If the data read by the component from the memory device matches the data written to the memory device, the component can determine that the memory device and/or the data path coupling the memory device to the memory sub-system controller are functioning as intended (e.g., are in a standard working order).

The method 670 can further include generating, by the component, data corresponding to an operation to test a memory device different than the memory device described in connection with blocks 671, 673, 675, 677, and 679. In some embodiments, the memory device can be a volatile memory device and the memory device different than the memory device can be a non-volatile memory device (or vice versa). For example, the memory device can be a system memory device, such as a DRAM (e.g., a dual-ported RAM) memory device, and the memory device different than the memory device can be a storage device, such as a NAND memory device, a three-dimensional cross-point memory device, or other non-volatile memory device.

The method 670 can further include causing, by the component, the data to be injected to the data path such that the data is written to the memory device different than memory device. In some embodiments, the data path that is used to write the data to the memory device different than the memory device described above in connection with blocks 671, 673, 675, 677, and 679. For example, the data path used to write the data to the memory device described in connection with blocks 671, 673, 675, 677, and 679 can be the data path 430 illustrated in FIG. 4, and the data path used to write the data to the memory device different than the memory device described in connection with blocks 671, 673, 675, 677, and 679 can be the data path 432 illustrated in FIG. 4.

The method 670 can include reading, by the component, the data written to the memory device different than the memory device. By reading the data written to the memory device different than the memory device, the component can verify that the data injected into the data path and written to the memory device different than the memory device matches, thereby providing an indication that the memory device different than the memory device and/or the data path are functioning properly, as described above.

The method 670 can further include determining, by the component, whether the data read by the component from the memory device different than the memory device matches the data written to the memory device different than the memory device. For example, component can compare the data that was generated and injected into the data path to the data retrieved from the memory device different than the memory device to determine whether the data read by the component from the memory device different than the memory device matches the data written to the memory device different than the memory device. If the data read by the component from the memory device different than the memory device matches the data written to the memory device different than the memory device, the component can determine that the memory device different than the memory device and/or the data path coupling the memory device different than the memory device to the memory sub-system controller are functioning as intended (e.g., are in a standard working order).

In some embodiments, the method 670 can include outputting, by the component, an indication corresponding to determining that the data read by the component from the memory device (or the memory device different than the memory device) matches the data written to the memory device (or the memory device different than the memory device) or outputting, by the component, an indication corresponding to determining that the data read by the component from the memory device (or the memory device different than the memory device) does not match the data written to the memory device (or the memory device different than the memory device).

Figure 7:
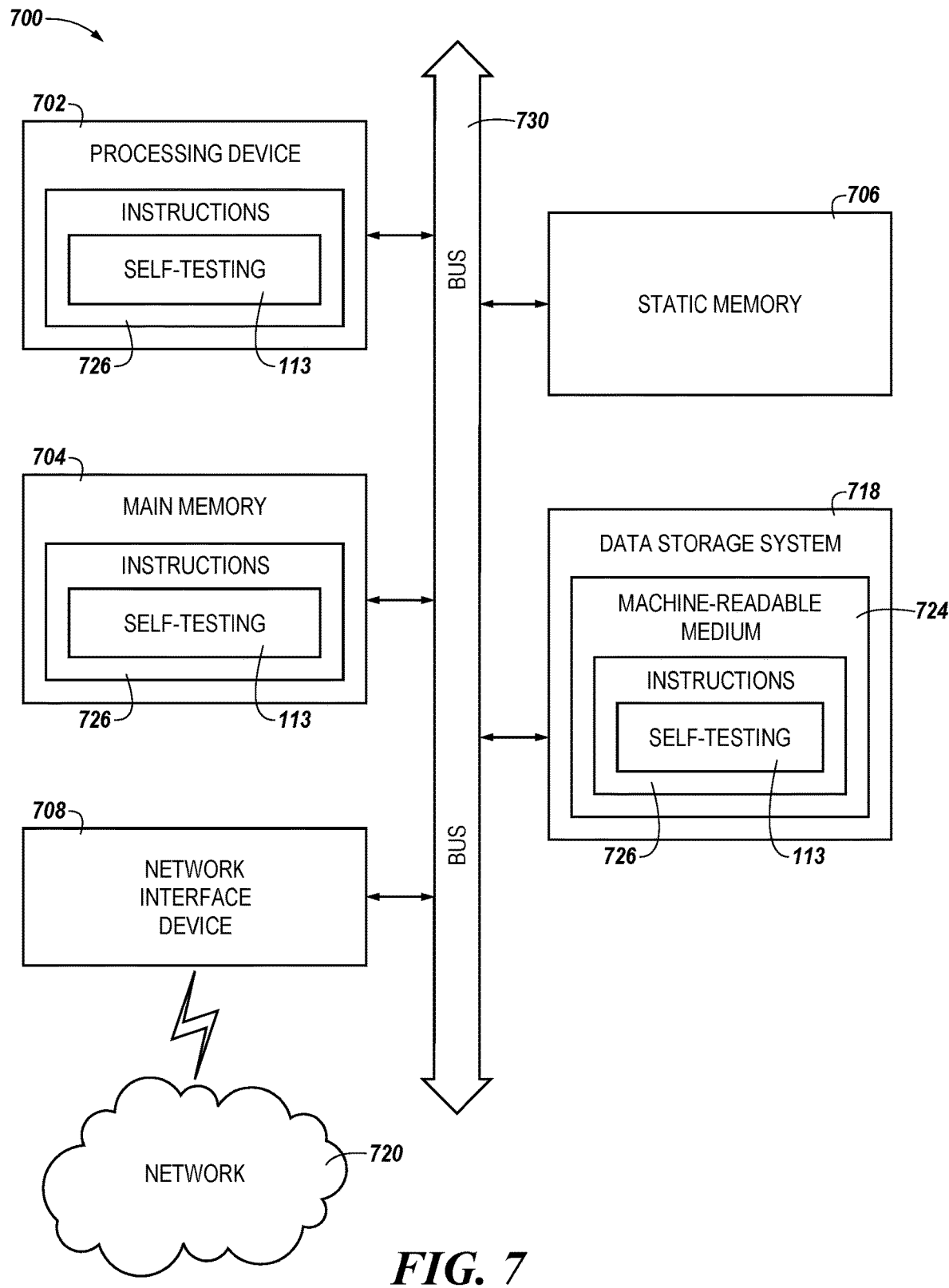
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the self-testing component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

The processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a self-testing component (e.g., the self-testing component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   requesting, by a component of a memory sub-system controller, control of a data path associated with a first memory device or a second memory device, or both, coupleable to the controller;
   generating, by the component, data corresponding to an operation to test the first memory device or the second memory device, or both;
   causing, by the component, the data to be injected to the data path such that the data is written to the first memory device or the second memory device, or both;
   reading, by the component, the data written to the first memory device or the second memory device, or both; and
   determining, by the component, whether the data read by the component from the first memory device matches the data written to the first memory device, whether the data read by the component from the second memory device matches the data written to the second memory device, or both, wherein one of the first memory device or the second memory device comprises a volatile memory device, and wherein the other of the first memory device or the second memory device comprises a non-volatile memory device.

2. The method of claim 1, wherein prior to causing the data to be injected to the data path, the data path is reserved for transferring of data between a host coupleable to the memory sub-system controller and the first memory device or the second memory device, or both.

3. The method of claim 1, further comprising outputting, by the component, an indication corresponding to determining that the data read by the component from the first memory device matches the data written to the first memory device or that the data read by the component from the second memory device matches the data written to the second memory device, or both.

4. The method of claim 1, further comprising outputting, by the component, an indication corresponding to determining that the data read by the component from the first memory device does not match the data written to the first memory device or that the data read by the component from the second memory device does not match the data written to the second memory device, or both.

5. A system, comprising:
   a plurality of memory devices; and
   a memory sub-system controller coupleable to the plurality of memory devices and comprising a component resident thereon to perform operations comprising:
      requesting control of a data path associated with at least one memory device among the plurality of memory devices;
      generating data corresponding to an operation to test a first memory device among the plurality;
      causing the data to be injected to the data path such that the data is written to the first memory device among the plurality;
      reading the data written to the first memory device among the plurality;
      determining whether the data read by the component from the first memory device among the plurality matches the data written to the first memory device among the plurality;
      generating data corresponding to an operation to test a second memory device among the plurality;
      causing the data to be injected to the data path such that the data is written to the second memory device among the plurality;
      reading the data written to the second memory device among the plurality; and
      determining whether the data read by the component from the second memory device among the plurality matches the data written to the second memory device among the plurality, wherein one of the first memory device or the second memory device comprises a volatile memory device, and wherein the other of the first memory device or the second memory device comprises a non-volatile memory device.

6. The system of claim 5, wherein the component comprises a built-in self-testing component deployed as an application-specific integrated circuit or a field-programmable gate array.

7. The system of claim 5, wherein the data corresponding to the operation to test the first memory device among the plurality comprises a specific bit pattern, a user control pattern, a bi-directional pin control data pattern, or a combination thereof.

8. The system of claim 5, wherein the component is configured to perform operations comprising:
   generating a first indication in response to a determination that the data read by the component from the first memory device among the plurality matches the data written to the first memory device among the plurality; and
   generating a second indication in response to a determination that the data read by the component from the first memory device among the plurality does not match the data written to the first memory device among the plurality.

9. The system of claim 5, wherein the data path is, prior to injection of the data corresponding to the operation to test the first memory device, used to transfer information between a host coupleable to the memory sub-system controller and at least one memory device among the plurality of memory devices.

10. A system, comprising:
    a memory sub-system controller;
    a first memory device coupled to the memory sub-system controller; and
    a second memory device coupled to the memory subsystem controller;
    wherein the memory sub-system controller comprises a component configured to:
       generate data corresponding to an operation to test the first memory device or the second memory device, or both;
       cause the data to be injected into a data path coupling at least one of the first memory device or the second memory device to the memory sub-system controller such that the data is written to at least one of the first memory device or the second memory device;
       read the data written to the at least one of the first memory device or the second memory device; and
       determine whether the read data matches the data written to the at least one of the first memory device or the second memory device, wherein one of the first memory device or the second memory device comprises a volatile memory device, and wherein the other of the first memory device or the second memory device comprises a non-volatile memory device.

11. The system of claim 10, wherein the component is configured to:
cause the data to be injected into the data path such that the data is written to the other of the first memory device or the second memory device;
read the data written to other of the first memory device or the second memory device; and
determine whether the data from the other of the first memory device or the second memory device matches the data written to the other of the first memory device or the second memory device.

12. The system of claim 10, wherein the memory sub-system controller further comprises a clock component, and wherein the component is configured to:
receive timing information from the clock component;
perform an operation to compare a frequency of a timing signal generated by the clock component to an expected timing signal; and
determine, based on the comparison, whether the frequency of the timing signal and the expected timing signal are substantially equivalent.

13. The system of claim 10, wherein the data path is, prior to injection of the data corresponding to the operation to test the first memory device or the second memory device, or both, used to transfer information between a host coupleable to the memory sub-system controller and the first memory device or the second memory device, or both.

14. The system of claim 10, wherein the component comprises and application-specific integrated circuit or a field-programmable gate array.

15. The system of claim 10, wherein the data corresponding to the operation to test the first memory device, the second memory device, or both comprises a specific bit pattern, an A5 bit pattern, a user control pattern, a bi-directional pin control data pattern, or a combination thereof.

* * * * *